United States Patent
Ko et al.

(10) Patent No.: US 7,097,948 B2
(45) Date of Patent: Aug. 29, 2006

(54) METHOD FOR REPAIR OF PHOTOMASKS

(75) Inventors: Wu Hung Ko, Kaohsiung (TW); Tung Yaw Kang, Taipei (TW); Chih Wei Wen, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 214 days.

(21) Appl. No.: 10/652,843

(22) Filed: Aug. 29, 2003

(65) Prior Publication Data

US 2005/0045584 A1    Mar. 3, 2005

(51) Int. Cl.
*G01F 9/00* (2006.01)
*C03C 15/00* (2006.01)
*C03C 25/68* (2006.01)

(52) U.S. Cl. .............................. 430/5; 216/66
(58) Field of Classification Search ............ 430/5; 216/58, 12, 66, 67; 204/192.35
See application file for complete search history.

(56) References Cited

U.S. PATENT DOCUMENTS

| 3,748,975 | A | 7/1973 | Tarabocchia |
| 4,200,668 | A | 4/1980 | Segal et al. |
| 5,965,301 | A | 10/1999 | Nara et al. |
| 6,190,836 | B1 | 2/2001 | Grenon et al. |
| 6,361,904 | B1 * | 3/2002 | Chiu ............................ 430/5 |
| 6,531,403 | B1 | 3/2003 | Ezaki et al. |

\* cited by examiner

*Primary Examiner*—S. Rosasco
(74) *Attorney, Agent, or Firm*—Duane Morris LLP

(57) ABSTRACT

The present invention relates to a method for removing etching assist gas from a fabrication system used during defect repair of a photomask in the fabrication of an integrated circuit, including: (a) inspecting the photomask and detecting a defect, the defect in a defect region; and (b) repairing the defect, wherein an amount, effective for the purpose of styrene is added to the system. By the method of the present invention, the amount of gas remaining on the MOS film is reduced, resulting in less surface defects present on the photomask.

12 Claims, No Drawings ically do not have chromium. Opaque defects are regions that are designed to be clear of chromium but which actually do have chromium.

METHOD FOR REPAIR OF PHOTOMASKS

FIELD OF THE INVENTION

This invention generally relates to a method of repairing defects in photomasks. More particularly, it relates to the use of a "gas purge" on a photomask during steps to repair opaque defects on photomasks.

BACKGROUND OF THE INVENTION

Photomasks are extensively used in the fabrication of integrated circuits on semiconductor wafers. Standard photomasks include a patterned absorbing or opaque film on a transparent substrate. A metal, such as chromium, having a thickness on the order of about 1000 ANG. is often used as the opaque film. Nickel and aluminum are also used. A transparent material, such as quartz, is often used as the substrate, though materials such as glass and sapphire can also be used. Phase shift photomasks may include in addition to patterned chromium on quartz, means to change the phase of light near the chromium edge, such as an etched region in the quartz or a transparent layer on the quartz near a chromium edge. Phase shift photomasks can also include, instead of a totally opaque material, an absorbing material, also called an attenuator, that permits transmission of a small fraction of the light. The fabrication of photomasks usually involves a blanket deposition of a thin film of the chromium opaque film on the quartz substrate. The chromium is then coated with photoresist, which is exposed with a high resolution technique, such as an electron ion beam, and developed to form the desired pattern in the resist. This pattern is then transferred into the chromium by etching, leaving opaque and transparent regions on the mask. The photomask manufacturing process usually has imperfections, and defects are therefore frequently encountered during inspection of the photomasks. Defects are categorized as either "clear defects," or "opaque defects." Clear defects are regions that are designed to have the chromium but which actually do not have chromium. Opaque defects are regions that are designed to be clear of chromium but which actually do have chromium.

Masks having sufficiently large structures can be repaired using a technique described in U.S. Pat. No. 3,748,975, to Tarabocchia, in which photoresist is applied to the mask and exposed in a rectangular region including the defect to either open up a window for etching opaque defects away or to leave a region of tinted negative photoresist to fill in clear defects. However, for opaque and clear defects that are attached to metal lines, normal process variations in the exposure develop, and etch steps are too great to remove just the required amount of defect and provide a line having the desired shape within the tolerance required of present and future masks. For example, masks are currently being generated with lines having a width of 0.3 um that typically have a tolerance in that width in the range 10% or, more preferably 5%. This precision is not achievable with standard photolithographic techniques, and the repair is likely either to leave unwanted material on the mask or to remove wanted material from the adjacent opaque region. Thus, present masks have been repaired using highly focused beams of photons or ions.

More specifically, opaque defect repair currently involves laser evaporation or ablation or focused ion beam (FIB) sputtering of the unwanted chromium in defect regions such as opaque bridge 21, opaque extension 26, and opaque spot 28. However, as with photolithographic processes, because the resolution of a laser is limited, if the opaque defect is connected to an adjacent chromium line laser ablation may damage that adjacent line, removing some wanted chromium from the line. In addition, because a great deal of thermal energy is transmitted with the laser beam, the laser ablation step not only melts and vaporizes the unwanted metal defect region, it also damages and removes a layer of quartz underlying and adjacent the opaque defect, producing roughness in the quartz. This damaged region of the quartz is also responsible for reduced transmission and altered phase of transmitted light.

As an alternative to laser ablation, FIB offers a very controlled process for sputtering a small region of unwanted material. The ion beam can be focused to a much smaller size than the laser beam. In addition, the ion beam physically sputters material, transmitting very little thermal energy to the mask; thus, the quartz is not pitted. However, there are several problems that limit the use of FIB for mask repair. First, because masks are formed on quartz substrates, an insulating material, the ion beam rapidly charges the surface, and both the ability to aim subsequent ions and to use the ion beam to image the results is degraded. Second, while an opaque defect is being removed, quartz at the edge of the defect is attacked at the same rate, and the result is a "river bed" or trench of damaged quartz around the defect, the quartz in this region having altered transmission and phase. Third, the focused ion beam species is typically gallium, and gallium has been found implanted into the quartz when the opaque defect is removed, causing transmission losses. Fourth, the sputtering of material by the ion beam leads to ejection of material in all directions, and some of this ejected material comes to rest on adjacent edges.

Clear defects can be repaired using a beam stimulated deposition process such as laser deposition or focused ion beam (FIB) induced deposition. These processes typically involve the decomposition of volatile organometallic complexes for which decomposition can be induced by the beam. Mask repair systems for laser deposition and FIB deposition have been commercially available for many years and the processes are well known in the art. However, a thin halo of deposited material is found adjacent the laser repaired region. The halo is the result of deposition along the periphery of the laser spot where there is a low but non negligible light intensity. Thus, the edges of laser deposited material are difficult to control and trimming is usually required. This trimming step introduces the same kinds of problems and defects seen when removing other opaque defects. Similarly, while FIB deposition to repair clear defects is more controllable than laser deposition, because the ion beam current profile also has a long tail which extends well beyond the nominal beam diameter, material is deposited in a relatively large area surrounding the intended deposit. This peripheral film is a fraction of the thickness of the intended deposit, but often must be removed to avoid degradation of transmission in surrounding clear regions. Removal of the peripheral film, or "halo" requires an extra step which adds to the complexity and time required for the repair process and introduces another possibility for damaging the quartz or otherwise introducing defects. In addition, because the quartz substrate charges during ion beam processing, the ion beam can be deflected and the repair patch will therefore not be located where expected.

One proposed clear defect repair technique, described in U.S. Pat. No. 4,200,668, to Segal et al. provides for repairing pin holes in the metal of a photomask by depositing resist on the mask, opening a window exclusively in the region of the pin hole by burning through the resist in that region with a laser, etching in the window to remove additional metal, thereby widening the pinhole and providing a more adhesive surface, depositing an opaque material on the entire surface, and then lifting off the opaque material on the resist, leaving it in the window adhering to the adjacent metal surrounding the pin hole. While this repair process is suitable for isolated pinhole defects, it is not adequate for clear defects at the edge of a metal line that required accurate reshaping and aligning.

Thus, a better solution is needed that provides a more reliable method of correcting opaque defects on photomasks, and this solution is provided by the following invention.

SUMMARY OF THE INVENTION

The present invention relates to a method for removing etching assist gas from a fabrication system used during defect repair of a photomask in the fabrication of an integrated circuit, comprising: (a) inspecting the photomask and detecting a defect, said defect in a defect region; and (b) repairing said defect, wherein an amount, effective for the purpose of styrene is added to the system. By the method of the present invention, the amount of gas remaining on the metal-oxide-semiconductor (MOS) film is reduced, resulting in less surface damage present on the photomask.

DESCRIPTION OF THE PREFERRED EMBODIMENTS

The present invention provides several process embodiments for repair of opaque defects. By the method of the present invention, etching assist gas is minimized by reaction with e.g., styrene. An etching assist gas such as xenon fluoride is reduced in a system undergoing etch repair, resulting in minimum critical dimension (CD) variation after high-frequency (e.g., 50 times) etch repair.

Prepositions, such as "on," "over," and "under" are defined with respect to a planar surface of the mask, regardless of the orientation the mask is actually held. A layer is on another layer even if there are intervening layers. By "etching assist gas," it is meant the assist gas used with ion beam scan during photomask repair.

In the testing of the present invention, both a bromine purge and styrene purge were carried out. Results demonstrated that the CD variation was markedly reduced through the use of the styrene purge, in this case 0.8 torr for 10 seconds.

Further in the testing of the present invention, it was found that with a standard bromine purge, the CD variation was 22.4% after scanning 30 times, while with a standard styrene purge, the CD variation was 3.8% after scanning 50 times. Thus, styrene is significantly more effective in preventing damage to the MOS film.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. In the fabrication of an integrated circuit, a method for removing etching assist gas from a fabrication system used during defect repair of a photomask, comprising:
    (a) inspecting the photomask and detecting a defect, said defect in a defect region; and
    (b) repairing said defect, wherein the etching assist gas is minimized by reaction with styrene, and the defect is an opaque defect.

2. The method as recited in claim 1, wherein the etching assist gas is xenon fluoride.

3. The method as recited in claim 1, wherein the amount of styrene added to the etching assist gas is about 0.8 torr.

4. The method as recited in claim 1, wherein the etching assist gas is used with ion beam scan during photomask repair.

5. A method for reducing surface defects present on a photomask in an integrated circuit fabrication system, comprising:
    (a) inspecting the photomask and detecting a defect, said defect in a defect region; and
    (b) repairing said defect, wherein the etching assist gas is minimized by reaction with styrene, and the defect is an opaque defect.

6. The method as recited in claim 5, wherein the etching assist gas is xenon fluoride.

7. The method as recited in claim 5, wherein the amount of styrene added to the etching assist gas is about 0.8 torr.

8. The method as recited in claim 5, wherein the etching assist gas is used with ion beam scan during photomask repair.

9. A method for reducing gas remaining on an MOS film of a photomask in an integrated circuit fabrication system, comprising:
    (a) inspecting the photomask and detecting a defect, said defect in a defect region; and
    (b) repairing said defect, wherein the etching assist gas is minimized by reaction with styrene, and the defect is an opaque defect.

10. The method as recited in claim 9, wherein the etching assist gas is xenon fluoride.

11. The method as recited in claim 9, wherein the amount of styrene added to the etching assist gas is about 0.8 torr.

12. The method as recited in claim 9, wherein the etching assist gas is used with ion beam scan during photomask repair.

* * * * *